United States Patent [19]

Park

[11] Patent Number: 5,132,576
[45] Date of Patent: Jul. 21, 1992

[54] SENSE AMPLIFIER HAVING LOAD DEVICE PROVIDING IMPROVED ACCESS TIME

[75] Inventor: Eungjoon Park, San Jose, Calif.

[73] Assignee: ICT International CMOS Technology, Inc., San Jose, Calif.

[21] Appl. No.: 609,205

[22] Filed: Nov. 5, 1990

[51] Int. Cl.$^5$ .................. H03K 3/01; G01R 19/00
[52] U.S. Cl. .................. 307/530; 307/296.8
[58] Field of Search ............ 307/530, 350, 296.8

[56] References Cited

U.S. PATENT DOCUMENTS

| 4,644,196 | 2/1987 | Flannagan | 307/530 |
| 4,695,744 | 9/1987 | Giordano | 307/530 |
| 4,748,349 | 5/1988 | McAlexander, III et al. | 307/530 |
| 4,845,672 | 7/1989 | Watanabe et al. | 307/530 |

Primary Examiner—David Hudspeth
Assistant Examiner—Andrew Sanders
Attorney, Agent, or Firm—Townsend and Townsend

[57] ABSTRACT

A current sense amplifier for an Erasable Programmable read only memory (EPROM) has an output node with a variable resistance PMOS transistor load device interconnected between a fixed voltage potential and the output node. A gate bias for the PMOS transistor load device is delayed whereby changes in conductance of the load device is delayed in response to a change in voltage on the output node. Access time for the sense amplifier is improved by the delayed change in conductance in the load device.

7 Claims, 2 Drawing Sheets

SENSE AMPLIFIER HAVING LOAD DEVICE PROVIDING IMPROVED ACCESS TIME

BACKGROUND OF THE INVENTION

This invention relates generally to sense amplifiers as used in reading and sensing data stored in memory arrays, and more particularly the invention relates to load devices for such amplifiers which allow faster data access times.

A sense amplifier is employed in reading data stored in a memory array. In a fast Erasable Programmable read only memory (EPROM), data (D) and the complement of data ($\overline{D}$) are stored in two adjacent memory transistors which are addressable by word lines (x address) and bit lines (y address). When a cell is addressed for data access, the stored datum and its complement are connected to the sense amplifier through selected gates. The data are sensed as either a voltage or a current.

In a CMOS current sense amplifier a diode-connected PMOS transistor often functions as a loading device (current mirror) in sensing the current. However, this load device often delays the sensing of current since when the output node voltage goes down, the conductivity of the load device goes higher and the fall time of the output node is delayed. Conversely, when a selected memory cell is not conducting, the load device pulls up the output node. However, as the output node goes up in voltage, the conductivity of the load device goes lower and the rise time of the output node is slowed.

The present invention is directed to a load device for a sense amplifier in which load conductivity is low when the output goes down and is high when the output goes up.

SUMMARY OF THE INVENTION

An object of the invention is a sense amplifier for a memory array having improved data access time.

Another object of the invention is a load device for a sense amplifier which facilitates voltage transitions on the output node of the amplifier.

Briefly, a load device is provided in a sense amplifier in which the load conductivity is low when the output node voltage goes down and is high when the output node voltage goes up. In a preferred embodiment, the load device comprises a diode connected PMOS transistor with delay included in the diode connection whereby conductance change in the transistor due to voltage changes at the output node is delayed. The delay can be provided by a native transistor (i.e. "0" threshold transistor) serially connected between the drain and gate of the load transistor whereby change in gate bias on the load transistor is delayed in response to changes in the voltage on the drain (output node) of the load transistor. In other embodiments the delay device can comprise a fixed resistor or a transistor having a fixed gate bias.

The invention and objects and features thereof will be more readily apparent from the following detailed description and appended claims when taken with the drawing.

DETAILED DESCRIPTION OF ILLUSTRATIVE EMBODIMENTS

Figure 1:
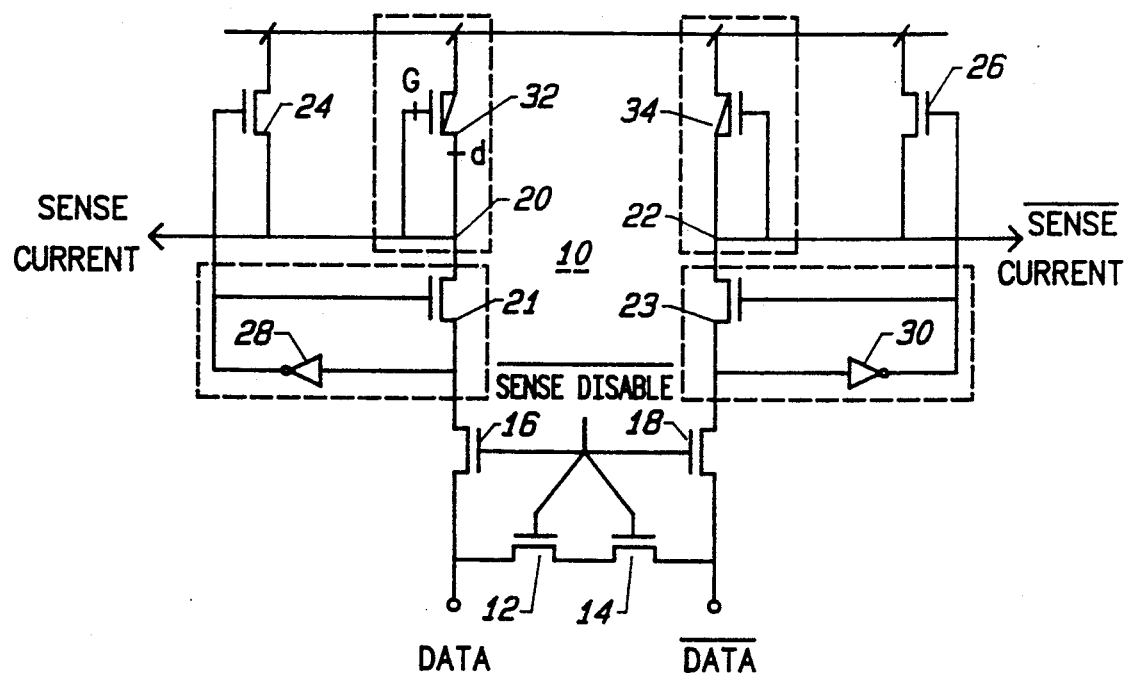
FIG. 1 is a schematic of a conventional sense amplifier.

Referring now to the drawing, FIG. 1 is a schematic of a sense amplifier shown generally at 10 as conventionally employed in sensing current as an indication of data stored in an Erasable Programmable read only memory (EPROM) using CMOS technology. Data (D) and data complement ($\overline{D}$) inputs to the sense amplifier are selectively connected to addressed cells in a memory array where each cell comprises two adjacent memory transistors which are programmed differently. The D input is connected to one memory transistor and the $\overline{D}$ line is connected to another memory transistor. After a particular memory cell is addressed in the memory array, the D and $\overline{D}$ inputs are connected to the sense amplifier through enabling circuitry including NMOS transistors 12 and 14 serially connected between the D and $\overline{D}$ lines, and NMOS transistors 16 and 18 which are serially connected in the D and $\overline{D}$ lines. When the sense amplifier is enabled (goes high) the D and $\overline{D}$ lines are connected to output nodes 20 and 22 of the amplifier through transistors 21 and 23, respectively. Connected between the output nodes 20 and 22 and VCC are NMOS transistors 24 and 26. Transistor 21 and invertor 28 are connected in parallel and provide bias voltage to transistor 24. Similarly, invertor 30 and transistor 23 are connected in parallel and provide bias voltage to transistor 26. Connected in parallel with transistor 24 is a PMOS transistor 32 with the gate connected to the drain, and connected in parallel with transistor 26 is a PMOS transistor 34 with the gate connected to the drain. The transistors 32 and 34 function as load devices and current mirrors for the D and $\overline{D}$ lines when the sense amplifier is enabled.

As above noted, this conventional load device often delays the sensing of current since when the output node voltage goes down, the conductivity of the load device goes higher and the fall time of the output node is delayed. Conversely, when the output node voltage rises, the conductivity of the load device goes lower and the rise time of the output node is slowed.

Figure 2:
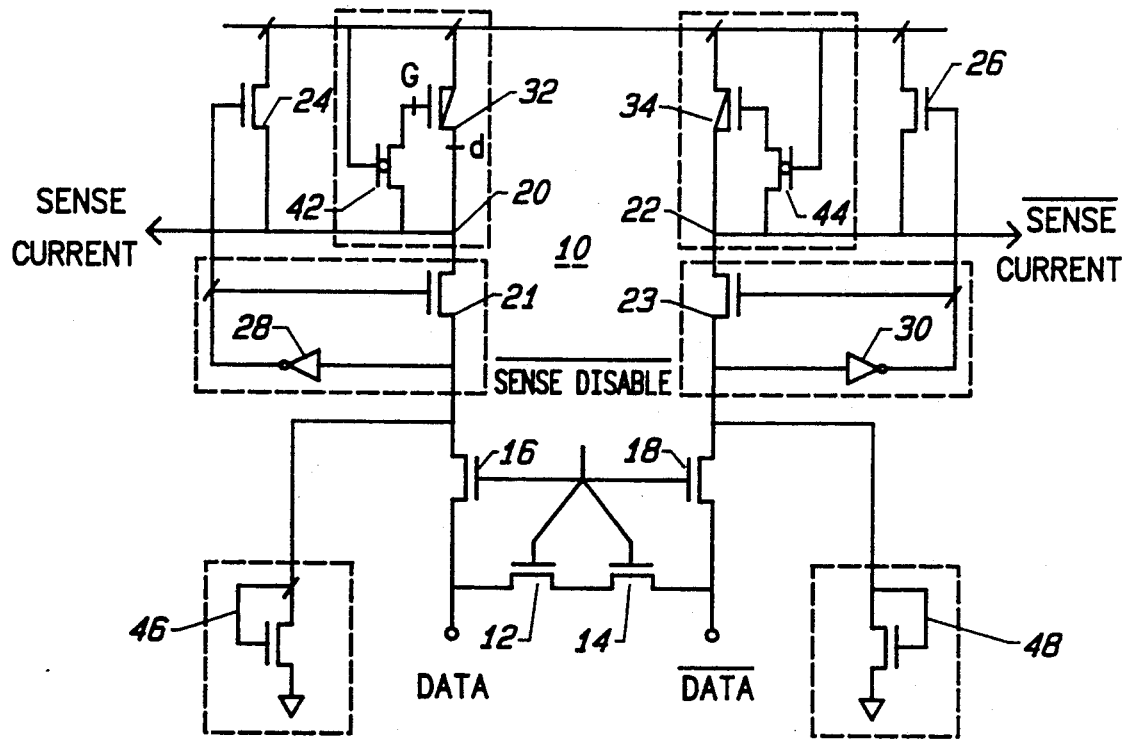
FIG. 2 is a schematic of a sense amplifier in accordance with one embodiment of the invention.

The present invention is directed to a load device for a sense amplifier in which change in load conductivity is delayed when the output goes down or when the output goes up. Referring now to FIG. 2, the sense circuit of FIG. 1 is modified in accordance with one embodiment of the present invention. Like elements have the same reference numerals. Basically, a native (eg 0 threshold) NMOS transistor 42 connects the gate of transistor 32 to the drain. Similarly, a native NMOS transistor 44 connects the gate of transistor 34 to the drain. The gates of transistors 42, 44 are connected to $V_{cc}$. The native transistors delay the change in conductance of the load transistors 32, 34 so that the load conductivity remains low when the output voltage goes down and remains high when the output voltage goes up. In effect, the native transistors provide a delay in the change in bias on the gates of the p-channel transistors 32, 34.

The sense amplifier of FIG. 1 is designed so that the sense nodes 20, 22 swing between 2.5 volts and 3.5 volts with VCC =4.5V. However, the improved loading scheme shown in FIG. 2 can cause the output node 20, 22 to rise above 3.5 volts to 3.7 volts which can be held at the output node by the nonconductance of transistors 32, 34. To alleviate this problem, diode connected transistors 46, 48 connect the D and $\overline{D}$ lines to ground. The transistors 46, 48 provide a high resistance shunt to ground which can bleed off any excess voltage above the 3.5 volts at the output node.

Figure 3A:
FIG. 3A-3C are schematics of delay devices useful with a sense amplifier load in accordance with other embodiments of the invention.
Figure 3B:
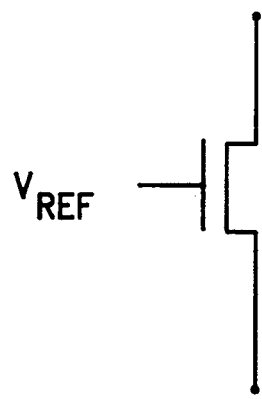
Figure 3C:
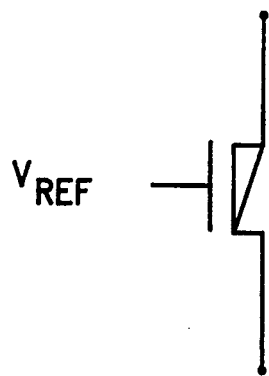

FIG. 3A-3C illustrate other embodiments of delay devices for use in the sense amplifier of FIG. 2. In essence, each of the devices is a resistor which can replace the native transistor 42, 44 in the amplifier of FIG. 2. In FIG. 3A a fixed resistor is employed, while in FIGS. 3B, 3C variable resistors are provided by an n-channel transistor and a p-channel transistor with the gates connected to a reference voltage, vref.

The use of a load device having delayed change in bias when voltage on the sense node is varied provides significantly improved access time to stored data. The following table shows access time ($T_{acc}$) for the conventional sense amplifier of FIG. 1 and for the sense amplifier in accordance with the invention as illustrated in FIG. 2. The two amplifiers were computer simulated and the access times were calculated for changes in an x address, change in a y address, and changes in both addresses. The times are given for the address being low and the output high ($t_{PLH}$) and for the address being high and the output low ($t_{PHL}$). The improvement in access time is readily apparent when using the load device in accordance with the present invention.

|  | $T_{ACC}$ with original Sense Amplifier | | $T_{ACC}$ with new Sense Amplifier | |
|---|---|---|---|---|
|  | $t_{PLH}$ | $t_{PHL}$ | $t_{PLH}$ | $t_{PHL}$ |
| change X address only | $42^{ns}$ | $40^{ns}$ | $38^{ns}$ | $35^{ns}$ |
| change Y address only | $29.5^{ns}$ | $32.5^{ns}$ | $29^{ns}$ | $33^{ns}$ |
| change both addresses | $30^{ns}$ | $34^{ns}$ | $29^{ns}$ | $33^{ns}$ |

There has been described a current sense amplifier having a load device which improves access time in sensing stored data. The amplifier also generates less noise when the output switches from low to low or from high to high. While the invention has been described with reference to a specific embodiments, the description is illustrative of the invention and is not to be construed as limiting the invention. Various modifications and applications may occur to those skilled in the art without departing from the true spirit and scope of the invention as defined by the appended claims.

I claim:

1. A load device for a sense amplifier having an output port comprising
   a variable resistance device comprising a first PMOS transistor having a gate electrode,
   said variable resistance device connected between said output port and a fixed voltage potential, the conductance of said device increasing as voltage on said output node decreases, and the conductance of said device decreasing as voltage on said output node increases, and
   means for delaying change in conductance of said device as voltage on said output node changes, said means for delaying change in conductance of said first PMOS transistor comprising a native NMOS transistor interconnected between said output node and said gate electrode, said NMOS transistor having a gate electrode connected to a reference potential.

2. The load device as defined by claim 1 wherein said reference potential comprises said fixed voltage potential.

3. A load device for a sense amplifier having an output port comprising
   a variable resistance device comprising a first PMOS transistor having a gate electrode,
   said variable resistance device connected between said output port and a fixed voltage potential, the conductance of said device increasing as voltage on said output node decreases, and the conductance of said device decreasing as voltage on said output node increases, and
   means for delaying change in conductance of said device as voltage on said output node changes, said means for delaying change in conductance of said PMOS transistor comprising a resistor interconnected between said gate electrode and said output node.

4. A load device for a sense amplifier having an output port comprising
   a variable resistance device comprising a first PMOS transistor having a gate electrode,
   said variable resistance device potential, the conductance of said device increasing as voltage on said output node decreases, and the conductance of said device decreasing as voltage on said output node increases, and
   means for delaying change in conductance of said device as voltage on said output node changes, said means for delaying change in conductance of said PMOS transistor comprising an NMOS transistor having a gate electrode, said NMOS interconnected between said output node and said gate electrode of said first PMOS transistor, and a reference potential connected to said gate electrode of said NMOS transistor.

5. A load device for a sense amplifier having an output port comprising
   a variable resistance device comprising a first PMOS transistor having a gate electrode,
   said variable resistance device connected between said output port and a fixed voltage potential, the conductance of said device increasing as voltage on said output node decreases, and the conductance of said device decreasing as voltage on said output node increases, and
   means for delaying change in conductance of said device as voltage on said output node changes, said means for delaying change in conductance of said first PMOS transistor comprising a second PMOS transistor having a gate electrode, said second PMOS transistor connected between said output node and said gate electrode of said PMOS transistor, and a reference potential connected to said gate electrode of said second PMOS transistor.

6. A current sense amplifier for use with memory in providing a sense current at an output node comprising
   an input line for receiving data from selected cells in said memory,
   a variable resistance load device connected between a fixed voltage potential and said output node of said amplifier, said variable resistance device comprising a first PMOS transistor having a gate electrode,
means for enabling said sense amplifier by connecting a selected cell to said output node, and
means for delaying change in conductance of said variable resistance load device as voltage on said output node changes, said means for delaying change in conductance of said first PMOS transistor comprising a native NMOS transistor interconnected between said output node and gate electrode, said NMOS transistor having a gate electrode connected to a reference potential.

7. The current sense amplifier as defined by claim 6 wherein said reference potential comprises said fixed voltage potential.

* * * * *